(12) United States Patent
Mayer et al.

(10) Patent No.: US 8,741,787 B2
(45) Date of Patent: Jun. 3, 2014

(54) INCREASED DENSITY OF LOW-K DIELECTRIC MATERIALS IN SEMICONDUCTOR DEVICES BY APPLYING A UV TREATMENT

(75) Inventors: Ulrich Mayer, Dresden (DE); Hartmut Ruelke, Dresden (DE); Christof Streck, Coswig (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 532 days.

(21) Appl. No.: 12/842,548

(22) Filed: Jul. 23, 2010

(65) Prior Publication Data

US 2011/0027989 A1  Feb. 3, 2011

(30) Foreign Application Priority Data

Jul. 31, 2009  (DE) .......................... 10 2009 035 417

(51) Int. Cl.
*H01L 21/768* (2006.01)

(52) U.S. Cl.
USPC ............................ 438/781; 438/623; 438/789

(58) Field of Classification Search
USPC .................. 438/789, 623, 781; 257/E21.242, 257/E21.333, E21.347, E21.576
See application file for complete search history.

(56) References Cited

U.S. PATENT DOCUMENTS

| | | | |
|---|---|---|---|
| 6,846,515 B2 | 1/2005 | Vrtis et al. ............... 427/255.29 |
| 7,166,531 B1 | 1/2007 | van den Hoek et al. ...... 438/623 |
| 7,253,125 B1 | 8/2007 | Bandyopadhyay et al. |
| 7,326,444 B1 | 2/2008 | Wu et al. |
| 7,998,882 B2 * | 8/2011 | Mayer et al. ................... 438/778 |
| 2002/0072220 A1 | 6/2002 | Wang et al. |
| 2005/0003568 A1 | 1/2005 | Yamazaki et al. .............. 438/30 |
| 2005/0048795 A1 * | 3/2005 | Ko et al. ........................ 438/778 |
| 2006/0024976 A1 | 2/2006 | Waldfried et al. ............ 438/778 |
| 2006/0078676 A1 | 4/2006 | Lukas et al. ................ 427/248.1 |
| 2006/0269693 A1 | 11/2006 | Balseanu et al. .............. 427/569 |
| 2007/0161256 A1 | 7/2007 | Gates et al. |
| 2008/0188074 A1 * | 8/2008 | Chen et al. .................... 438/623 |
| 2008/0199977 A1 | 8/2008 | Weigel et al. ..................... 438/4 |
| 2010/0055899 A1 * | 3/2010 | Mayer et al. ................... 438/666 |

OTHER PUBLICATIONS

Translation of Official Communication from German Patent Office for German Patent Application No. 10 2009 035 417.4 dated Mar. 17, 2010.

Translation of Official Communication from German Patent Application No. 10 2009 035.417.4 dated Aug. 20, 2013.

* cited by examiner

*Primary Examiner* — Zandra Smith
*Assistant Examiner* — Toniae Thomas
(74) *Attorney, Agent, or Firm* — Amerson Law Firm, PLLC

(57) ABSTRACT

A silicon-based low-k dielectric material is formed on the basis of a single precursor material, such as OMTCS, without incorporating a porogen species. To this end, the initial deposition of the low-k dielectric material may be formed on the basis of a reduced process temperature, while a subsequent treatment, such as a UV treatment, may allow the adjustment of the final material characteristics without causing undue out-gassing of volatile organic components.

26 Claims, 4 Drawing Sheets

INCREASED DENSITY OF LOW-K DIELECTRIC MATERIALS IN SEMICONDUCTOR DEVICES BY APPLYING A UV TREATMENT

BACKGROUND OF THE INVENTION

1. Field of the Invention

Generally, the present disclosure relates to the fabrication of integrated circuits, and, more particularly, to the formation of dielectric material layers of reduced permittivity.

2. Description of the Related Art

Semiconductor devices and any other microstructures are typically formed on substantially disc-shaped substrates made of any appropriate material. The majority of semiconductor devices including highly complex electronic circuits are currently being, and in the foreseeable future will be, manufactured on the basis of silicon, due to the virtually unlimited availability of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array, wherein most of the manufacturing steps, which may involve several hundred individual process steps in sophisticated integrated circuits, are performed simultaneously for all chip areas on the substrate, except for photolithography processes, metrology processes and packaging of the individual devices after dicing the substrate. Thus, economic constraints drive semiconductor manufacturers to steadily increase the substrate dimensions, thereby also increasing the area available for producing actual semiconductor devices and thus increasing production yield. On the other hand, device dimensions are continuously reduced in view of performance criteria, as, typically, reduced transistor dimensions provide an increased operating speed.

In modern integrated circuits, the circuit elements are formed in and on a semiconductor layer, while most of the electrical connections are established in one or more "wiring" layers, also referred to as metallization layers, wherein the electrical characteristics, such as resistivity, electromigration, signal propagation delay, etc., of the metallization layers significantly affect the overall performance of the integrated circuit. Due to the ongoing demand for shrinking the feature sizes of highly sophisticated semiconductor devices, copper, in combination with a low-k dielectric material, has become a frequently used alternative in the formation of the wiring structures comprising the metallization layers having metal line layers and intermediate via layers. Metal lines act as intra-layer connections and vias act as inter-layer connections, which commonly connect individual circuit elements to provide the required functionality of the integrated circuit. Typically, a plurality of metal line layers and via layers stacked on top of each other are necessary to realize the connections between all internal circuit elements and I/O (input/output), power and ground pads of the circuit design under consideration.

For extremely scaled integrated circuits, the signal propagation delay is no longer limited by the circuit elements, for instance by silicon-based field effect transistors, but is limited, owing to the increased density of circuit elements, which requires an even more increased number of electrical connections for mutually connecting these circuit elements, by the close proximity of the metal lines, since the line-to-line capacitance increases as the spacing between the metal lines decreases. For example, in presently available devices produced by volume production techniques, the distance between neighboring metal lines may be 100 nm and less in some metallization levels. This fact in combination with a reduced conductivity of the lines due to a reduced cross-sectional area results in increased RC (resistance capacitance) time constants. For this reason, traditional dielectrics, such as silicon dioxide (k>4) and silicon nitride (k>6-7) are increasingly replaced in metallization layers by dielectric materials having a lower permittivity, which are therefore also referred to as low-k dielectrics having a relative permittivity of approximately 3 or less.

However, in very advanced semiconductor devices with reduced distances between neighboring metal lines, such as the 45 nm technology node, the resulting parasitic RC time constants may still be considered inappropriate, thereby requiring even lower values for the dielectric constant of the inter metal dielectric material. For this purpose, the dielectric constant may further be reduced to values of 2.7 and less, in which case such dielectric materials may also be referred to as ultra low-k (ULK) materials. Thus, great efforts have been made in developing materials and corresponding manufacturing techniques usable in high volume production. To this end, a plurality of spin-on processes, in combination with corresponding polymer materials, may frequently be used, while, in other approaches, plasma enhanced chemical vapor deposition (CVD) techniques have been proven to be promising techniques for providing low-k dielectric materials. For example, in many approaches, the basic dielectric constant of a plurality of CVD deposited low-k dielectric materials may further be reduced by reducing the material density, which may frequently be accomplished by incorporating so-called porogens, i.e., organic materials including methyl groups that may be removed, at least partially, after the deposition so as to produce a porous dielectric material having the desired reduced dielectric constant.

For example, a plurality of process techniques have been established in which hydrogen-containing organic silicon materials may be provided to act as a basic low-k dielectric material and thus as a backbone for ULK materials, while additionally appropriate precursor species may be introduced into the deposition ambient during the plasma enhanced CVD process in order to incorporate volatile components into the basic low-k dielectric material. After deposition of the low-k dielectric material, a further treatment, such as a treatment based on ultraviolet light, may be performed so as to specifically break up chemical bonds of the porogens and to cause out-diffusion of the corresponding modified molecules, thereby generating respective nano voids in the basic low-k dielectric material.

Although the deposition of low-k dielectric materials by means of plasma enhanced CVD techniques has proven to be a very promising approach for sophisticated semiconductor devices, it turns out, however, that a further reduction of the dielectric constant to a value of 2.7 and less on the basis of a single precursor material may be extremely difficult, while, in other approaches, a more complex deposition regime may be used on the basis of at least two different precursor materials, thereby also resulting in a complex manufacturing sequence which may additionally result in non-desired characteristics of the low-k dielectric materials, as will be described in more detail with reference to FIGS. 1a and 1b.

FIG. 1a schematically illustrates a cross-sectional view of a semiconductor device 100 which comprises a substrate 101 that may include any circuit elements, such as transistors, capacitors and the like. For convenience, any such circuit elements are not shown. The substrate 101 represents a bulk silicon substrate or an SOI substrate since, typically, complex integrated circuits produced by volume production techniques may be formed on the basis of a silicon material, as previously explained. Furthermore, a dielectric layer 102, which may be comprised at least partially of a low-k material or any other dielectric material, is formed above the substrate 101 and represents a portion of a metallization level or a contact structure of the semiconductor device 100. For example, a metal region 103 is formed in the dielectric layer 102 and represents any conductive device area, such as a contact area of a circuit element or a metal region of a metallization layer. The metal region 103 is separated from the material of the dielectric layer, if required, by a barrier layer 104, which is typically provided as a layer for reducing diffusion of metal atoms into the dielectric material 102 and also to reduce diffusion of atoms from the dielectric layer 102 into the metal region 103. Additionally, the barrier layer 104 may also enhance adhesion of the metal region 103 to the dielectric material of the layer 102. In sophisticated devices, the metal region 103 comprises copper and the barrier layer 104 may be formed from one or more layers including tantalum, tantalum nitride, titanium, titanium nitride and the like. Frequently, a dielectric barrier layer or cap layer 105 comprised of a dielectric material that substantially prevents diffusion of metal atoms of the metal region 103 into neighboring dielectric areas is provided, while, in other cases, the layer 105 may additionally have etch stop capabilities during the patterning of a further dielectric layer 106, which represents a layer of dielectric material having a desired reduced dielectric constant, as described above. For example, the dielectric barrier or cap layer 105 may comprise silicon nitride, silicon carbide, nitrogen-containing silicon carbide and the like, which may efficiently reduce copper diffusion and may also provide enhanced mechanical integrity and the desired etch stop capabilities. It should be appreciated that additional dielectric materials may also be provided between the dielectric layer 102 and the layer 106, if required. The layer 106 may be comprised of a mixture of silicon, oxygen, hydrogen and carbon which may thus form the basic material network of the layer 106, the density of which may further be reduced in a subsequent manufacturing stage by partially removing a porogen material 107 in order to obtain a dielectric constant of 2.7 and less, as may be required for an enhanced performance of the semiconductor device 100.

A typical process flow for forming the semiconductor device 100 as shown in FIG. 1a may comprise the following processes. After forming the basic structures of any circuit elements in and above the substrate 101, the dielectric layer 102 and the metal region 103 are formed on the basis of well-established process techniques. Next, the dielectric barrier or cap layer 105 is deposited, for instance, by plasma enhanced CVD on the basis of well-established process recipes in order to form the desired composition of materials. Thereafter, the dielectric layer 106 is deposited by a plasma enhanced CVD process 108 in which a plasma ambient is established by applying an appropriate electromagnetic power with a frequency of 10-15 MHz, which may be capacitively or inductively coupled into the plasma ambient. During the deposition process, a first precursor, indicated as Precursor 1, for instance in the form of a silane derivative, a siloxane derivative and the like, is supplied to the plasma ambient in combination with any appropriate carrier gases, such as noble gases and the like, thereby obtaining reactive molecules in the ambient 108, which may deposit above the substrate 101, i.e., on the layer 105. For this purpose, a process temperature is selected to be above approximately 300° C., for instance in the range of 350-500° C., thereby forming a basic network in the form of the layer 106, which may provide the desired moderately low dielectric constant in combination with specific chemical and mechanical characteristics. Moreover, during the deposition process 108, a second precursor material, indicating as Precursor 2, is supplied in order to incorporate an organic species, such as a complex molecule including a methyl group, which may thus be incorporated into the basic network of the material generated on the basis of the first precursor species. Consequently, during the deposition process 108, the porogens 107 may be incorporated into the basic material of the layer 106 with a certain concentration that may strongly depend on the overall process parameters of the process 108. Hence, the overall characteristics of the layer 106 including the porogens 107 are to be established by controlling a plurality of process parameters, which relate to at least two different precursor materials which require different flow rates and specific ramp up times, stabilization phases and the like which contributes to the overall complexity of the deposition process 108. Furthermore, due to the presence of the precursor species 2, i.e., the precursor material producing the porogens 107, a significant portion of volatile deposition byproducts may also be present in the deposition ambient 108 and may thus contaminate the substrate 101 and other exposed surface areas of a process tool used to establish the ambient of the deposition process 108. Consequently, the conditions for depositing the layer 106 above the plurality of substrates 101 may also strongly depend on the history of the process tool and may thus require sophisticated cleaning processes on a regular basis, thereby contributing to a significantly reduced throughput of the corresponding deposition tools.

FIG. 1b schematically illustrates the semiconductor device 100 in a subsequent manufacturing stage in which the device 100, i.e., the layer 106, is exposed to ultraviolet (UV) radiation during a process 109, during which elevated temperatures, for instance in the range of 300-500° C., in combination with an appropriate gaseous ambient are established. For example, an "inert" gas ambient, for instance a noble gas ambient, a nitrogen ambient and the like, is established at a pressure of several Torr while UV radiation with a wavelength of 200 nm or less is applied in order to break up chemical bonds, thereby initiating out-diffusion of organic molecules 107A. Consequently, during the treatment 109, the initial density of the layer 106 is reduced, for instance by forming nano voids 106A, due to the out-diffusion of a part of the previously incorporated porogens 107 (FIG. 1a). Due to the reduction of the density, a certain degree of shrinkage 106S is thus caused during the process 109, which may result in a reduced layer thickness, while the chemical and mechanical characteristics of the final layer 106 may also be influenced by the degree of shrinkage 106S. For example, typically, shrinkage of approximately 15 percent or higher with respect to the initial volume or layer thickness may be observed during the process 109 in order to obtain a reduced dielectric constant of 2.6 and less. It should be appreciated that, due to the out-diffusion of the species 107A, a significant contamination of the corresponding process tool may also occur, thereby also requiring a frequent cleaning of the process tools. Hence, the treatment 109 in combination with the previously incorporated porogens 107 (FIG. 1a) may contribute to a significant degree of shrinkage and device and tool contamination, thereby reducing overall process throughput, while at the same time increasing complexity of controlling the overall process result, for instance in view of layer characteristics, such as final layer thickness, mechanical stability, chemical stability, dielectric constant and the like.

Consequently, although the above-described process sequence based on at least two different precursor materials may enable the formation of dielectric materials having a dielectric constant of 2.6 and less, the resulting increased high degree of process complexity in controlling the process results in combination with the requirement of frequent complex cleaning processes may render this concept less attractive. On the other hand, well-established process recipes for forming a silicon-based low-k dielectric material by using plasma enhanced CVD techniques on the basis of a single precursor material without incorporation of a porogen may not allow a further reduction of the dielectric constant to a value of approximately 2.6 and less.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming sophisticated low-k dielectric materials on the basis of plasma enhanced CVD processes without requiring complex process control mechanisms by avoiding the presence of a complex precursor material system during the deposition process. To this end, in some illustrative embodiments disclosed herein, a precursor material may be used to form the basic low-k dielectric material without incorporating a highly volatile species, such as porogens and the like, while a subsequent treatment, for instance on the basis of UV radiation, may be applied to obtain the final reduced dielectric constant and desired chemical and mechanical characteristics. That is, undue out-diffusion of any organic species may be avoided while nevertheless obtaining a desired low dielectric constant so that the frequency of complex cleaning processes due to process tool contamination and the like may be significantly reduced. At the same time, superior process control may be accomplished during the deposition of the basic dielectric material since specifically selected porogen precursor materials may not be required. In some illustrative embodiments disclosed herein, a silicon-based dielectric material may first be deposited on the basis of a less complex precursor material system, such as a single precursor material, at a reduced temperature of approximately 300° C. and less, thereby producing a material layer with reduced density and a lesser degree of cross-linking. Subsequently, the density may be increased by applying energy, for instance in the form of UV radiation and the like, in order to increase the material density, while nevertheless obtaining a desired low dielectric constant. In this manner, superior chemical and mechanical characteristics may be adjusted on the basis of the deposition parameter, which may be controlled in a very efficient manner due to the simplified precursor material system, and on the basis of the subsequent treatment, while, in both process steps, undue contamination of substrates and process tools may be substantially avoided. Moreover, the degree of shrinkage during the subsequent treatment of the low-k dielectric material may be maintained at a moderately low level, for instance at approximately 10 percent or less, which may also contribute to superior overall process controllability. Consequently, reliability and cost effectiveness of the resulting semiconductor products may be increased.

One illustrative method disclosed herein comprises depositing a low-k dielectric material above a substrate of a semiconductor device at a process temperature of approximately 300° C. or less by establishing a plasma ambient based on a precursor species and one or more carrier gases. The method further comprises treating the low-k dielectric material on the basis of UV radiation.

A further illustrative method disclosed herein comprises depositing a low-k dielectric material above a substrate of a semiconductor device by establishing a plasma in a gaseous deposition ambient that comprises a single silicon-containing precursor material. The method further comprises exposing the low-k dielectric material to at least one of ultraviolet radiation and a particle beam so as to densify the low-k dielectric material and to control shrinkage of the low-k dielectric material to approximately 10 percent or less of an initial volume of the low-k dielectric material.

A still further illustrative method disclosed herein comprises forming a low-k dielectric material layer of the metallization system of a semiconductor device by performing a plasma enhanced chemical vapor deposition process at a first process temperature of 300° C. or less. The method further comprises exposing the low-k dielectric material layer to at least one of ultraviolet radiation and a particle beam in an inert gas ambient at a second process temperature of 300° C. or higher.

BRIEF DESCRIPTION OF THE DRAWINGS

The disclosure may be understood by reference to the following description taken in conjunction with the accompanying drawings, in which like reference numerals identify like elements, and in which.

Figure 1A:
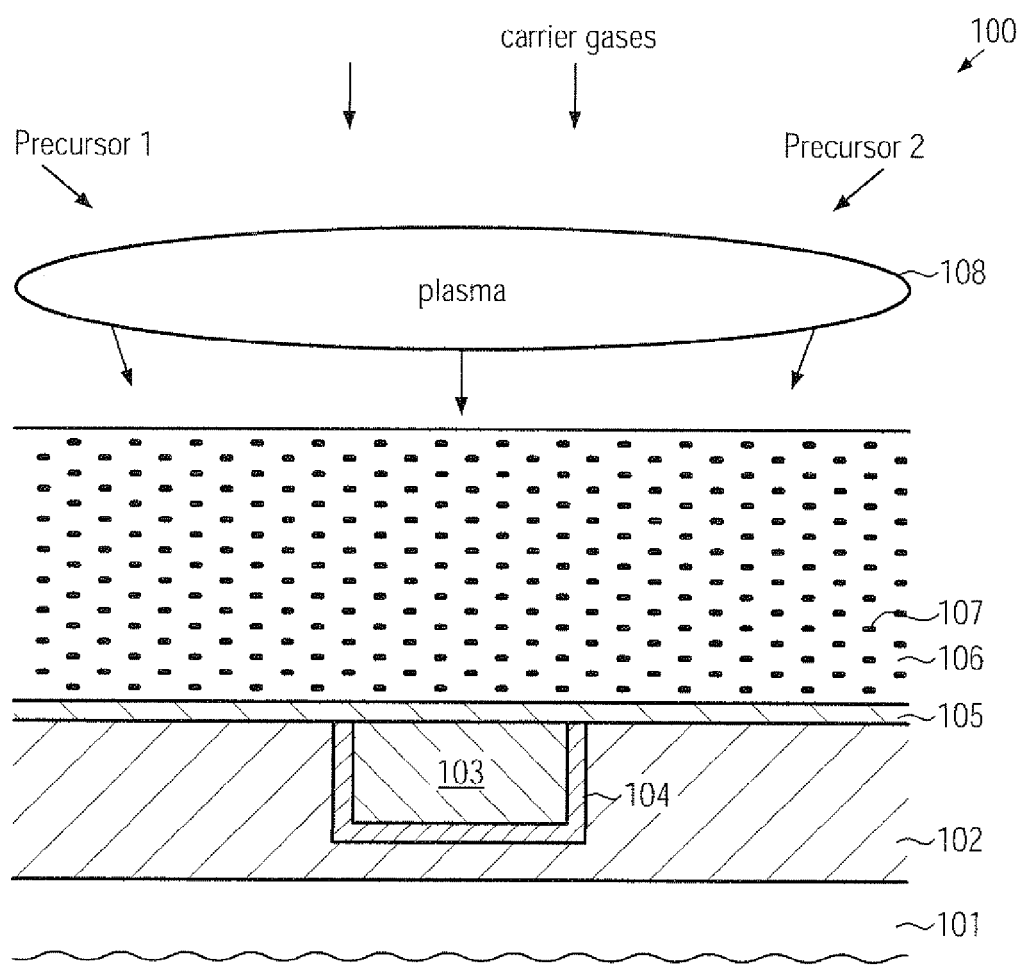
FIG. 1a schematically illustrates a cross-sectional view of a semiconductor device during a manufacturing stage when depositing a low-k dielectric material on the basis of a plasma enhanced deposition process on the basis of at least two different precursor material species for forming a basic material network and incorporating a porogen, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general the principles disclosed herein relate to plasma enhanced CVD techniques for depositing low-k dielectric materials on the basis of superior process conditions compared to complex deposition strategies, in which at least two different precursor materials have to be applied in order to incorporate a volatile organic species in the basic low-k dielectric material. However, contrary to conventional approaches in which a low-k dielectric material is deposited on the basis of a single precursor material having a dielectric constant of 2.7 and higher, the techniques disclosed herein are based on a process strategy in which the basic low-k dielectric material may be deposited on the basis of superior process conditions with a reduced density and degree of cross-linking, wherein the final characteristics of the low-k dielectric material, such as dielectric constant, density, elasticity, hardness and the like, may be further adjusted during a subsequent treatment on the basis of energetic particles and/or radiation, such as UV radiation. On the other hand, due to the avoidance of porogens during the deposition of the basic low-k material, undue out-diffusion of any organic components may be avoided or at least be significantly reduced. Hence, a desired low dielectric constant may be achieved on the basis of superior process controllability with a significantly increased overall process throughput due to a significant reduction of the number of cleaning processes due to the reduced degree of tool contamination. Furthermore, the shrinkage of the initially deposited low-k dielectric material during the subsequent treatment may be maintained at approximately 10 percent or less, thereby also contributing to an increased degree of controllability of the entire process sequence.

In one illustrative embodiment disclosed herein, a single precursor material in the form of octamethylcyclotetrasiloxane (OMCTS) may be used during the plasma enhanced deposition process, which represents a well-established precursor material for depositing silicon-based dielectric materials. Consequently, corresponding resources for handling and processing the precursor material may be used in forming a low-k dielectric material with enhanced reliability.

Figure 1B:
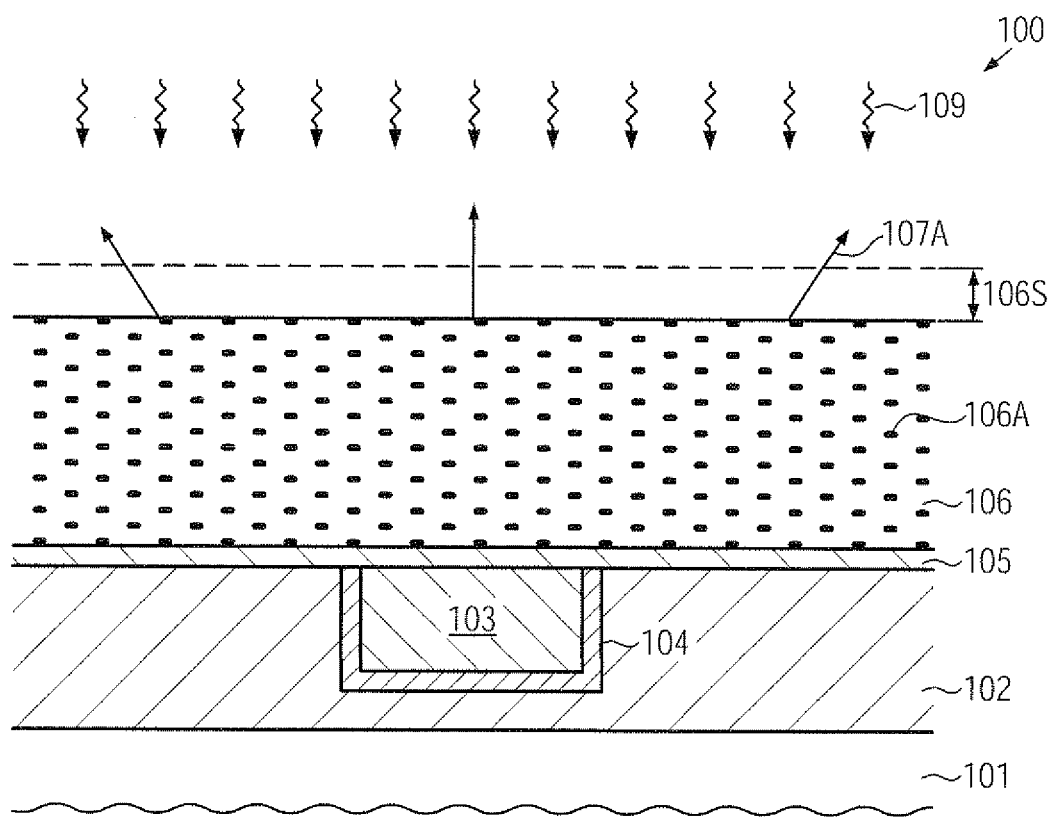
FIG. 1b schematically illustrates the semiconductor device during a UV radiation treatment for adjusting the final dielectric constant by out-diffusing organic components of the porogens, according to conventional strategies.
Figure 2A:
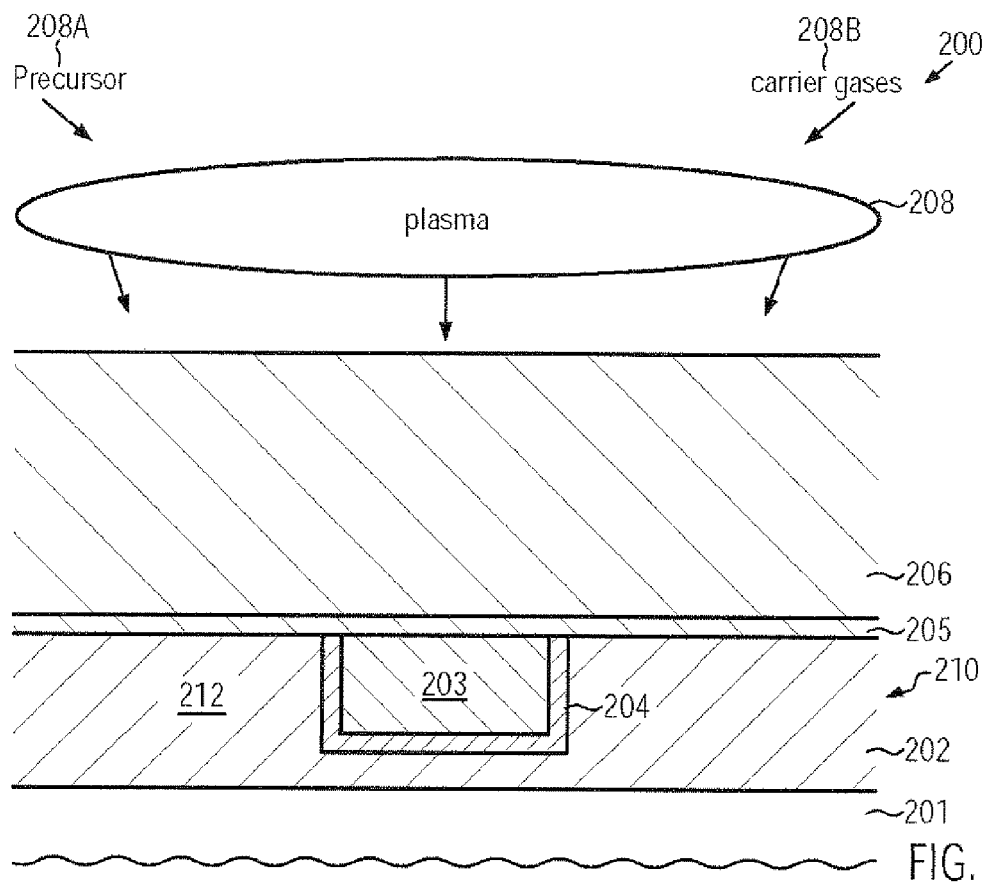
FIG. 2a schematically illustrates a cross-sectional view of a semiconductor device during a plasma enhanced deposition process for forming a dielectric base material with reduced density on the basis of a single precursor material, according to illustrative embodiments.
Figure 2B:
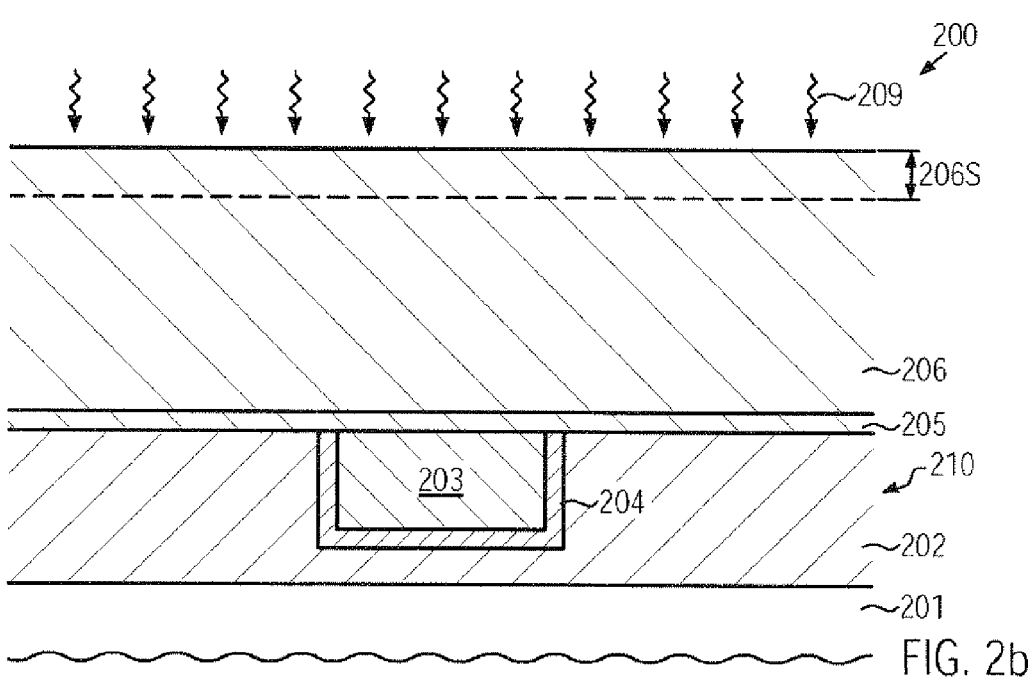
FIG. 2b schematically illustrates the semiconductor device when exposed to a process ambient for increasing density of the material, for instance on the basis of UV radiation, while avoiding undue out-diffusion of material components, according to illustrative embodiments.
Figure 2C:
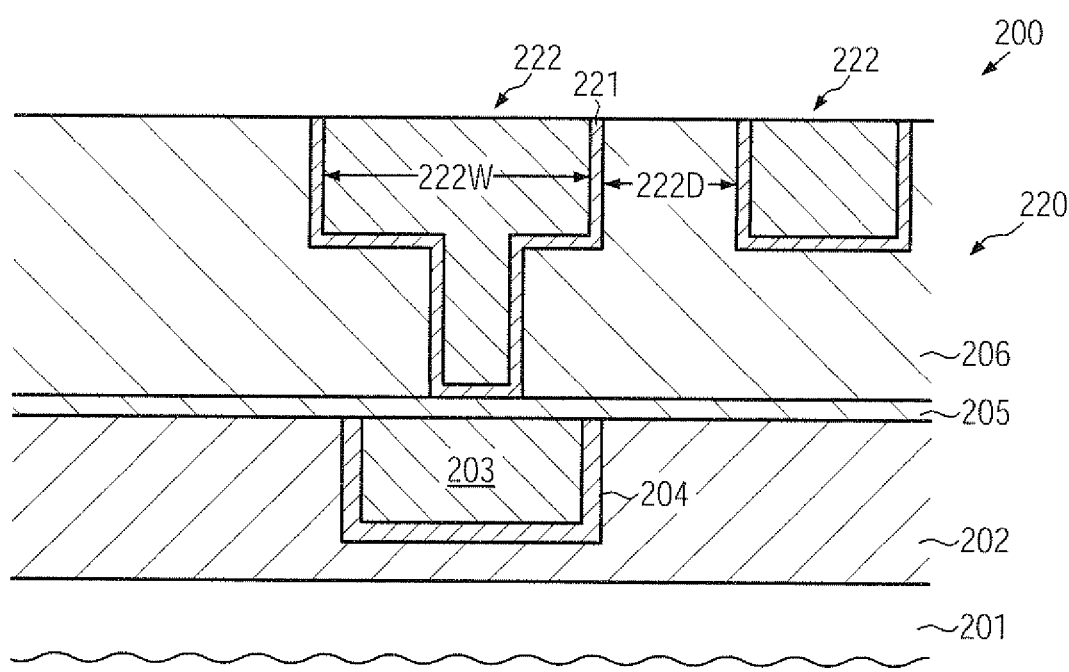
FIG. 2c schematically illustrates the semiconductor device in a further advanced manufacturing stage in which densely packed metal lines are formed in the low-k dielectric material, according to still further illustrative embodiments.

With reference to FIGS. 2a-2c further illustrative embodiments will now be described in more detail, wherein reference may also be made to FIGS. 1a-1b, if appropriate.

FIG. 2a schematically illustrates a cross-sectional view of a semiconductor device 200 comprising a substrate 201 in and above which may be formed device features, such as circuit elements of complex integrated circuits in the form of transistors, capacitors, resistors and the like. These circuit elements or device features may be provided in one or more device levels, wherein, for convenience, a device level 210 is illustrated in FIG. 2a for illustrative purposes. It should be appreciated that the device level 210 may represent a semiconductor material containing, for instance, silicon and the like, in and above which semiconductor elements, such as transistors, diodes and the like, may be formed. In other cases, the device level 210 may represent an appropriate contact structure connecting to respective circuit elements (not shown) which may be provided in a lower lying device level. In still other illustrative embodiments, the device level 210 may represent a metallization layer of a metallization system of the device 200, wherein a further metallization layer is to be formed above the device level 210 on the basis of a low-k dielectric material. For example, the device level 210 may comprise a dielectric material 212, which may be provided in the form of a conventional dielectric material, such as silicon dioxide, silicon nitride and the like, or in the form of a low-k dielectric material having a dielectric constant of 3.0 or less.

In this context, it should be appreciated that the dielectric constant of a dielectric material of the semiconductor device 200 may be determined on the basis of any appropriate test structures, for instance in the form of capacitive elements formed on specific test substrates or test structures of the substrate 201, wherein these capacitive elements may be operated on the basis of AC signals with known characteristics in order to determine the dielectric constant on the basis of a corresponding response of the capacitive element or test structure under consideration. For example, it is well known that the capacitance of a capacitive element depends, in addition to the geometric configuration, from the material characteristics, i.e., the dielectric characteristics of a material positioned between corresponding electrodes of the capacitor. Moreover, the dielectric value may be determined for a frequency range in which the dielectric value may be substantially independent from a change of frequency, thereby obtaining a value that may be comparable with other dielectric values obtained in other semiconductor devices.

A circuit feature 203 may be provided in the device level 210, for instance in the form of a metal region, which may include a conductive barrier material 204, when a direct contact of a highly conductive metal, such as copper and the like, with the dielectric material 212 is considered inappropriate. Moreover, a dielectric layer 205, for instance in the form of silicon nitride, silicon carbide, nitrogen-containing silicon carbide, silicon dioxide and the like, or any combination of two or more of these materials, may be provided. Additionally, a further device level, for instance in the form of a metallization layer and the like, may be provided above the device level 210 and, in the manufacturing stage shown, may comprise a low-k dielectric material 206. In some illustrative embodiments, the low-k dielectric material 206 may represent a silicon-containing dielectric material, which may, for instance, comprise oxygen, carbon, hydrogen and the like, which may also be considered as an "organic" silicon-based material. The layer 206 may have a moderately reduced density, that is, the degree of cross-linking within the material of the layer 206 may be maintained at a moderately low level, which may be accomplished by appropriately adjusting process parameters of a deposition process 208.

Generally, the semiconductor device 200 may be formed on the basis of well-established process techniques in accordance with the associated design rules, which may, for instance, require the formation of circuit elements, such as the element 203, with critical dimensions of 50 nm and less, when transistor elements are considered. When the device feature 203 represents a metal line, a width may be 100 nm and less in sophisticated applications. For this purpose, the dielectric material 202 may be deposited and may be subsequently patterned on the basis of photolithography and etch techniques, followed by the deposition of appropriate materials, such as the conductive barrier material 204, and a metal such as copper and the like when the device level 210 represents a metallization layer. Thereafter, any excess material may be removed, for instance by chemical mechanical polishing (CMP), followed by the deposition of the material 205, for instance using plasma enhanced CVD techniques. Next, a process ambient may be established for the deposition process 208, which may include the supply of an appropriate precursor material 208A and one or more carrier gases 208B, on the basis of which a plasma may be created. For this purpose, any appropriate deposition tool may be used in which the plasma ambient for the process 208 may be established, as is, for instance, also described above with reference to the device 100. In one illustrative embodiment, the precursor material 208A may be supplied as a single substance so that appropriate deposition conditions may be readily controlled by selecting a single ramp up time, i.e., a time for introducing the precursor material 208A, and by establishing a desired equilibrium condition, i.e., by stabilizing the concentration of precursor molecules in the ambient of the process 208. Appropriate parameters, for instance with respect to flow rate of the precursor 208A and the one or more carrier gases 208B, may be obtained for a given deposition tool on the basis of experiments starting from conventional deposition recipes. For example, using a silicon-containing precursor material, such as OMCTS, a pressure in the ambient 208 of approximately 3-7 Torr may be established on the basis of a supply of 2000-5000 mgm of the precursor material 208A in a process tool that is configured to process 300 mm substrates. The flow rates in standard cubic cm per minute (SCCM) of one or more carrier gases, such as noble gases and the like, may be selected in a range of approximately 500-2000 SCCM. In some illustrative embodiments, additionally, oxygen gas may be supplied, wherein, for the above-specified process conditions, a flow rate of 0-500 SCCM may be selected. During the deposition process 208, the degree of cross-linking of the material of the layer 206 may strongly depend on the process temperature, i.e., the surface temperature of the device 200, which, in some illustrative embodiments, is selected to be approximately 300° C. and less, for instance in a range of 200-300° C., in order to maintain a moderately reduced material density. Under these process conditions, which may allow superior process control due to the absence of further precursor materials, which are conventionally introduced into a plasma enhanced deposition ambient for incorporating a porogen species, the layer 206 may be deposited with any desired thickness, wherein a certain degree of shrinkage may also be taken into account, which may be caused in a subsequent process step for adjusting the final characteristics of the dielectric material 206.

FIG. 2b schematically illustrates the semiconductor device 200 during a treatment 209 for densifying the material layer 206. In one illustrative embodiment, the treatment 209 may be performed on the basis of UV radiation with a wavelength of approximately 200 nm and less in order to reconfigure the molecular structure of the material 206, which may also be referred to as "curing," thereby increasing the density of the material 206. During the treatment 209, an appropriate gaseous ambient may be established, for instance by supplying "inert" gases, such as helium, argon, nitrogen, or any combination thereof, and the like, with an appropriate flow rate in order to obtain a desired process pressure, which, in some illustrative embodiments, may be selected to be approximately 4-9 Ton. Moreover, the effectiveness of the treatment 209 may be enhanced by applying an elevated process temperature, i.e., a temperature of approximately 300° C. and higher, wherein, in some illustrative embodiments, a temperature range of 300-500° C. may be selected. For example, for a process tool configured to process 300 mm substrates and for a flow rate of approximately 5000 SCCM and higher for the inert gases, in combination with a temperature and a pressure as specified above, an efficient increase of material density and thus superior mechanical characteristics of the material 206 may be obtained, while significantly reducing the out-gassing of any volatile organic components, such as methyl groups, since a specific porogen species may not have been incorporated into the layer 206 during the preceding deposition process 208 of FIG. 2a. It should be appreciated that an appropriate power density of any radiation or an energetic particle beam, such as an electron shower, ion bombardment and the like, may be readily determined by performing corresponding experiments in which different power densities may be applied for otherwise constant process conditions in order to adjust the desired final material characteristics of the layer 206. Consequently, the degree of shrinkage 206S of the initial layer 206 during the treatment 209 may be adjusted by selecting appropriate parameters of the treatment 209 for a given initial material configuration of the layer 206. For example, in some illustrative embodiments, the shrinkage 206S may be controlled to approximately 10 percent or less of the initial volume or thickness of the layer 206, thereby contributing to a superior degree of predictability of the characteristics of the layer 206 and thus of the entire device 200. Consequently, the material configuration of the layer 206 may be controlled with high efficiency during the deposition process 208 (FIG. 2a) due to the avoidance of complex precursor material systems during deposition, wherein a reduced deposition temperature may provide a reduced density and degree of cross-linking of the material of the layer 206. Based on this initial material configuration, the final characteristics of the layer 206, such as density, dielectric constant and the like, may be efficiently adjusted by selecting appropriate process parameter values for the treatment 209. Therefore, a desired low dielectric constant of approximately 2.7 and less may be obtained with a reduced degree of shrinkage, while at the same time other characteristics, such as mechanical characteristics, dielectric strength and the like, may be superior compared to conventional approaches providing a silicon-based dielectric material having the same dielectric constant. Moreover, due to the significantly reduced degree of out-gassing during the deposition and the treatment of the layer 206, overall process throughput may be significantly increased as the complexity and/or the number of cleaning processes for the corresponding process tools may be reduced.

As an example, for parameter values used during the deposition process 208 and the treatment 209 as illustrated in FIGS. 2a and 2b, as specified before, the following material characteristics for the layer 206 may be achieved:

The shrinkage of the material layer 206 in percent: 5-15, wherein, in some illustrative embodiments, the shrinkage may be maintained at less than 10 percent;
Density in gram per $cm^3$: 1.15-1.35;
Elasticity of the material 206 expressed by Young's modulus E in GPa: 5-9;
Hardness of the layer 206 in GPa: 0.75-1.4;
Dielectric constant: 2.5-2.7;
Leakage current at a supplied electrical field of 1 MV per cm, wherein the leakage current is expressed in Ampere/$cm^2$: less than $5^{-10}$;
Internal stress level of the layer 206 expressed in MPa: less than 75.

Consequently, superior mechanical characteristics, such as hardness, elasticity and internal stress level, may be provided to enable superior process conditions during the further processing of the layer 206, while nevertheless a desired low dielectric constant may be obtained.

FIG. 2c schematically illustrates the semiconductor device 200 in a further advanced manufacturing stage according to further illustrative embodiments. As illustrated, a plurality of metal lines 222 may be formed in the dielectric material 206, which may have the material characteristics as specified above. The metal lines 222 may comprise an appropriate metal, such as copper, copper alloys and the like, possibly in combination with a conductive barrier material 221, in order to reduce an interaction of the conductive metal with the low-k dielectric material of the layer 206. The metal lines 222 may have critical dimensions, i.e., a width 222W corresponding to the design rules of the technology standard under consideration, wherein a corresponding width may be 100 nm and less. Similarly, a distance 222D between adjacent two of the metal lines 222 may be selected in accordance with the design rules and may be 100 nm and less, such as 60 nm and less, in highly sophisticated semiconductor devices according to the 45 nm technology. In this case, the dielectric constant of the material 206 may be selected to be 2.6 and less, wherein the otherwise superior material characteristics, for instance in view of dielectric strength, hardness, elasticity and the like, may provide appropriate conditions during the process sequence for forming the metal lines 222. That is, the cleaning of the material 206, providing of etch masks in combination with hard mask materials and the like may be performed on the basis of superior surface conditions of the layer 206, which may additionally have moderately uniform material characteristics with respect to hardness and dielectric constant, as previously explained, thereby enhancing the overall patterning regime for forming corresponding openings in the layer 206. Thereafter, the barrier material 221 in combination with a desired metal, such as copper, may be filled in to the openings by well-established process techniques. During the removal of any excess material, the superior mechanical characteristics of the layer 206 may further contribute to enhanced performance and reliability of the metallization layer 220. Furthermore, during the patterning of openings for the metal lines 222, possibly in combination with additional vias, the reduced degree of shrinkage of the layer 206 may result in a more predictable geometric configuration of the final metal lines 222, thereby also contributing to increased uniformity of device characteristics of the device 200.

As a result, the present disclosure provides techniques for forming low-k dielectric materials and ULK materials on the basis of plasma enhanced CVD processes by using a well-controllable precursor material, such as OMTCS, while avoiding the incorporation of a porogen species during the deposition of the basic dielectric material. In a subsequent treatment, the final characteristics of the dielectric material may be specifically adjusted. Consequently, superior overall process controllability may be accomplished without requiring specific porogen species, thereby also significantly reducing complexity and production costs for dielectric materials in metallization systems of semiconductor devices for a given dielectric constant value, compared to conventional strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
depositing a low-k dielectric material above a substrate of a semiconductor device at a first process temperature of approximately 300° C. or less by establishing a plasma ambient based on a precursor species and one or more carrier gases; and
establishing a process ambient on the basis of an inert gas at a second process temperature of approximately 300° C. or higher and treating said low-k dielectric material on the basis of ultraviolet (UV) radiation in said process ambient.

2. The method of claim 1, wherein said precursor species is a single gas component.

3. The method of claim 1, wherein said precursor species comprises octamethylcyclotetrasiloxane (OMCTS).

4. The method of claim 1, wherein a pressure in said plasma ambient is in the range of approximately 3-7 Torr.

5. The method of claim 1, wherein said plasma ambient is established on the basis of oxygen gas.

6. The method of claim 1, wherein said second process temperature is approximately 500° C. or less.

7. The method of claim 1, wherein said process ambient is established at a pressure of approximately 4-9 Torr.

8. The method of claim 1, further comprising forming metal lines in said dielectric material, wherein two adjacent ones of said metal lines have a distance of approximately 100 nm or less.

9. The method of claim 1, further comprising adjusting a volume reduction of said low-k dielectric material during said treatment based on UV radiation to approximately 10% or less relative to a volume of said low-k dielectric material prior to said UV treatment.

10. The method of claim 1, wherein said first process temperature is approximately 200° C. or higher.

11. The method of claim 1, further comprising exposing said low-k dielectric material to a particle beam in said process ambient.

12. A method, comprising:
depositing a low-k dielectric material above a substrate of a semiconductor device by establishing a plasma in a gaseous deposition ambient comprising a single silicon-containing precursor material, wherein said gaseous deposition ambient is established at a process temperature of less than approximately 300° C.; and
exposing said low-k dielectric material to at least ultraviolet (UV) radiation so as to densify said low-k dielectric material and to control shrinkage of said low-k dielectric material to approximately 10% or less of an initial volume of said low-k dielectric material, wherein exposing said low-k dielectric material to at least said UV radiation comprises establishing an inert gas ambient at a second process temperature of approximately 300° C. or higher.

13. The method of claim 12, wherein said process temperature is approximately 200° C. or higher.

14. The method of claim 12, wherein a pressure in said inert gas ambient is set to be approximately 4-9 Torr.

15. The method of claim 12, wherein a pressure in said gaseous ambient is set to be approximately 3-7 Torr.

16. The method of claim 12, wherein said silicon-containing precursor material comprises octamethylcyclotetrasiloxane (OMCTS).

17. The method of claim 12, wherein a dielectric constant of said low-k dielectric material layer is 2.7 or less after exposure to said UV radiation.

18. The method of claim 12, further comprising exposing said low-k dielectric material to a particle beam in said inert gas ambient.

19. A method, comprising:
forming a low-k dielectric material layer of a metallization system of a semiconductor device by performing a plasma enhanced chemical vapor deposition process at a first process temperature of 300° C. or less; and
exposing said low-k dielectric material layer to at least one of ultraviolet (UV) radiation and a particle beam in an inert gas ambient at a second process temperature of 300° C. or higher.

20. The method of claim 19, wherein a dielectric constant of said low-k dielectric material layer is 2.7 or less.

21. The method of claim 19, wherein said low-k dielectric material layer is deposited on the basis of a single silicon-containing precursor material.

22. The method of claim 21, wherein a pressure during said plasma enhanced chemical vapor deposition process is in the range of approximately 3-7 Torr.

23. The method of claim 19, further comprising maintaining shrinkage of said low-k dielectric material to approximately 10 percent or less when exposing said low-k dielectric material to said UV radiation.

24. The method of claim 19, further comprising forming metal lines in said low-k dielectric material layer, wherein a distance between at least two adjacent metal lines is approximately 100 nm or less.

25. A method, comprising:
depositing a low-k dielectric material above a substrate of a semiconductor device at a first process temperature that is in the range of 200-300° C. by establishing a plasma ambient based on a precursor species and one or more carrier gases; and
establishing a process ambient on the basis of an inert gas at a second process temperature that is in the range of 300-500° C. and treating said low-k dielectric material on the basis of ultraviolet (UV) radiation in said process ambient.

26. A method, comprising:
forming a low-k dielectric material layer of a metallization system of a semiconductor device by performing a plasma enhanced chemical vapor deposition process at a first process temperature that is in the range of approximately 200-300° C.; and
exposing said low-k dielectric material layer to at least one of ultraviolet (UV) radiation and a particle beam in an inert gas ambient at a second process temperature that is in the range of approximately 300-500° C.

* * * * *